(12) United States Patent
Meng et al.

(10) Patent No.: US 8,900,042 B2
(45) Date of Patent: Dec. 2, 2014

(54) FAN TYPE TEMPERATURE CONTROL METHOD AND DEVICE

(75) Inventors: Yanni Meng, Shenzhen (CN); Hui Rong, Shenzhen (CN); Mingming Liu, Shenzhen (CN); Baohang Zhou, Shenzhen (CN); Shuwang Wei, Shenzhen (CN); Lingqiao Teng, Shenzhen (CN)

(73) Assignee: ZTE Corporation, Shenzhen, Guangdong (CN)

( * ) Notice: Subject to any disclaimer, the term of this patent is extended or adjusted under 35 U.S.C. 154(b) by 372 days.

(21) Appl. No.: 13/498,642

(22) PCT Filed: May 12, 2010

(86) PCT No.: PCT/CN2010/072683

§ 371 (c)(1),
(2), (4) Date: Mar. 28, 2012

(87) PCT Pub. No.: WO2011/038590

PCT Pub. Date: Apr. 7, 2011

(65) Prior Publication Data

US 2012/0184199 A1    Jul. 19, 2012

(30) Foreign Application Priority Data

Sep. 29, 2009  (CN) .......................... 2009 1 0177309

(51) Int. Cl.
*F24F 7/007*    (2006.01)
*H05K 7/20*    (2006.01)
*G05D 23/19*   (2006.01)
*G06F 1/20*    (2006.01)

(52) U.S. Cl.
CPC ........ *H05K 7/20209* (2013.01); *G05D 23/1912* (2013.01); *G06F 1/20* (2013.01); *G06F 1/206* (2013.01)
USPC ............ 454/258; 454/239; 454/256; 318/471

(58) Field of Classification Search
CPC .......... G05D 23/1912; H05K 7/20209; H05K 7/20745
USPC .................. 454/184, 256, 258; 318/455, 471; 361/695
See application file for complete search history.

(56) References Cited

U.S. PATENT DOCUMENTS

| 5,488,835 A | 2/1996 | Howenstine et al. |
| 6,070,660 A | 6/2000 | Byrnes et al. |

(Continued)

FOREIGN PATENT DOCUMENTS

| CN | 1506785 A | 6/2004 |
| CN | 1627220 A | 6/2005 |
| CN | 1959284   | 5/2007 |

(Continued)

OTHER PUBLICATIONS

International Search Report for PCT/CN2010/072683, English translation attached to original, Both Completed by the Chinese Patent Office on Aug. 2, 2010, All together 11 Pages.

(Continued)

*Primary Examiner* — Kang Hu
*Assistant Examiner* — Dana Tighe
(74) *Attorney, Agent, or Firm* — Brooks Kushman P.C.

(57) ABSTRACT

A fan type temperature control method and device are provided. The device includes a fan unit including a plurality of fans and cooling an apparatus to be cooled, power supplies (v1,v2) supplying power for the fans in the fan unit, and a fan control unit which controls the fans as follows: when temperature t of the apparatus is lower than critical temperature t1 of a first temperature detect switch (k01), all fans stop; when t is higher than t1 and lower than critical temperature t2 of a second temperature detect switch (k02), all fans rotate at half speed; when t is higher than t2 while lower than critical temperature t3 of a third temperature detect switch (k03), a first fan part (M1) rotates at full speed and a second fan part (M2) stops; when t is higher than t3, all fans rotate at full speed.

16 Claims, 4 Drawing Sheets

(56) References Cited

U.S. PATENT DOCUMENTS

| | | | |
|---|---|---|---|
| 6,573,671 B2 * | 6/2003 | Montero et al. | 318/53 |
| 6,922,038 B2 * | 7/2005 | Horng et al. | 318/825 |
| 2003/0015983 A1 | 1/2003 | Montero et al. | |
| 2008/0042603 A1 * | 2/2008 | Chen | 318/109 |
| 2008/0170947 A1 | 7/2008 | Sutardja | |
| 2009/0144568 A1 | 6/2009 | Fung | |
| 2009/0167228 A1 * | 7/2009 | Chung et al. | 318/455 |

FOREIGN PATENT DOCUMENTS

| | | |
|---|---|---|
| CN | 101667042 A | 3/2010 |
| JP | 60113723 A | 6/1985 |
| RU | 2201557 | 3/2003 |

OTHER PUBLICATIONS

Russian Office Action for RU 2012115529/08, English Translation attached to original, Dated Sep. 11, 2013, All together 11 Pages.

* cited by examiner

FAN TYPE TEMPERATURE CONTROL METHOD AND DEVICE

CROSS-REFERENCE TO RELATED APPLICATION

This application is the U.S. national phase of PCT Appln. No. PCT/CN2010/072683 filed May 12, 2010 which claims priority to Chinese Application No. 200910177309.7 filed Sep. 29, 2009, the disclosures of which are incorporated in their entirety by reference herein.

TECHNICAL FIELD

The present invention relates to a forced air-cooling thermal design scheme, and more especially, to a fan type temperature control method and device.

BACKGROUND OF THE RELATED ART

With the increasingly high integration level of the systems, the widespread use of the large power devices, the requirements of miniaturization of the product volume, more extensive application environments, and the continuous improvement of the system working speed, thermal management design has become an indispensable means to improve system reliability.

In the thermal design, considering the heat flux density of the device, the volumetric power density and temperature rise, the common cooling methods are natural cooling and forced air cooling. When the heat flux of the electronic device is more than 0.08 w/cm$^2$ and the volumetric power density is over 0.18 w/cm$^3$, the natural cooling alone cannot completely solve the cooling problem, and many systems require additional dynamic to maintain sufficient air flow to carry out forced air cooling or other cooling methods. The forced air cooling method which takes the fans as the main components are widely used.

The common fan temperature control schemes are: Pulse Width Modulation (PWM) intelligent temperature control fan, fan circuit serial thermistor, voltage comparator output to adjust the fan speed, and so on. In the PWM fan adjustment, depending on the temperature, the temperature control fan has a different speed regulator corresponding to the temperature, and since it is the real-time adjustment of the pulse width signal, the fan speed change is very sensitive, and the speed change and the temperature change are almost synchronous. The main principle of the fan circuit serial thermistor is that when the power supply starts to work, if the fan supply voltage is 7V, with the rising of temperature within the power supply, the resistance value of thermistor is gradually reduced, therefore, the fan voltage is gradually increased and the fan speed is also increased, so that the muting effect can be achieved when the load is light, and the cooling is ensured when the load is large. For the voltage comparator output to adjust the fan speed, an control electrical signal is generated by detecting the temperature and according to the temperature, the output end of the temperature measurement circuit is connected to the first input end of the comparator circuit, the second input end of the comparator circuit is input with the reference electrical signal, the comparator circuit compares the control electrical signal and the reference electrical signal, and generates an output electrical signal output to the speed control circuit so as to adjust the fan speed.

When it is required to be simply, fast, and low cost to achieve fan grading governing the aforementioned method becomes complicated and has some shortcomings at the same time. The PWM temperature control circuit takes a single-chip computer as the core, and the intelligent control of the fan can only be achieved through the close coordination between the hardware and software, which is relatively speaking, high cost, complicated implementation, and is generally applied to the scenes in which the fan speed is required to be precisely controlled. The drawback of the fan circuit serial thermistor method is that the low temperature range of the NTC thermistor is very wide, so what can be adjusted is only the fan speed but the stop of the fans can not be controlled when the temperature is suitable, thus it cannot meet the requirements of energy conservation. For the scheme of voltage comparator output to adjust the fan speed, it needs to design specialized temperature measurement circuit, comparator circuit and speed control circuit, of which the circuit design is relatively complicated.

SUMMARY OF THE INVENTION

The technical problem to be solved in this invention is to provide a simple and effective fan type temperature control method and device.

To solve the aforementioned technical problem, a fan type temperature control method in the present invention comprises:

a step of low temperature processing, in which when temperature t of an apparatus to be cooled is lower than a preset first temperature t1, circuits of all fans remain disconnected, and all the fans stop;

a step of medium temperature processing, in which when the temperature t of the apparatus to be cooled is higher than the preset first temperature t1 and is lower than a preset second temperature t2, a voltage which is lower than a voltage of a power supply of a temperature control device is applied to all the fans, and all the fans rotate at a speed which is less than a maximum speed; and a step of high temperature processing, in which when the temperature t of the apparatus to be cooled is higher than a preset third temperature t3, the voltage of the power supply of the temperature control device is applied to all the fans, and all the fans rotate at full speed;

wherein, $t1 < t2 \leq t3$.

The step of medium temperature processing also comprises: when $t2 < t3$, and the temperature t of the apparatus to be cooled is higher than the preset second temperature t2 but lower than the preset third temperature t3, the voltage of the power supply of the temperature control device is applied to a first fan part, meanwhile, the circuit of a second fan part is disconnected, the first fan part rotate at full speed, and the second fan part stops.

In the step of medium temperature processing, the voltage lower than the voltage of the power supply of the temperature control device is a half of the voltage of the power supply of the temperature control device.

To solve the aforementioned technical problem, the fan type temperature control device in the present invention comprising a fan unit, a power supply and a fan control unit; wherein, the fan unit comprises a plurality of fans, and the fan unit is set to: cool an apparatus to be cooled;

the power supply is set to: provide electrical power for running of fans in the fan unit;

the fan control unit is set to: control the fans in the fan unit based on a following scheme:

when temperature t of an apparatus to be cooled is lower than a preset first temperature t1, circuits of all fans remain disconnected, and all the fans stop;

when the temperature t of the apparatus to be cooled is higher than the preset first temperature t1 and is lower than a preset second temperature t2, a voltage which is lower than a voltage of a power supply of a temperature control device is applied to all the fans, and all the fans rotate at a speed which is less than a maximum speed;

when the temperature t of the apparatus to be cooled is higher than a preset third temperature t3, the voltage of the power supply of the temperature control device is applied to all the fans, and all the fans rotate at full speed;

wherein, t1<t2≤t3.

The fan unit comprises a first fan part and a second fan part; the fan control unit is also set to: the scheme used to control the fans in the fan unit further comprises:

when t2<t3, and the temperature t of the apparatus to be cooled is higher than the preset second temperature t2 but lower than the preset third temperature t3, the voltage of the power supply of the temperature control device is applied to a first fan part, meanwhile, the circuit of a second fan part is disconnected, the first fan part rotate at full speed, and the second fan part stops.

Said fan control unit is set to: the voltage lower than the voltage of the power supply is half of the voltage of the power supply. Said fan control unit comprises three temperature detect switches and one diode, and the three temperature detect switches are a first temperature detect switch, a second temperature detect switch and a third temperature detect switch;

one end of the first fan part is connected to an anode of the power supply and the other end is connected to one end of the first temperature detect switch, the other end of the first temperature detect switch is connected to an anode of the diode, one end of the second fan part is connected to a cathode of the diode, and the other end of the second fan part is connected to a cathode of the power supply; one end of the second temperature detect switch is connected between said first fan part and said first temperature detect switch, and the other end is connected to the cathode of the power supply; one end of the third temperature detect switch is connected to the cathode of the diode, and the other end is connected to the anode of the power supply;

the first temperature detect switch is set to be closed when the temperature t of the apparatus to be cooled is higher than the preset first temperature t1;

the second temperature detect switch is set to be closed when the temperature t of the apparatus to be cooled is higher than the preset second temperature t2;

the third temperature detect switch is set to be closed when the temperature t of the apparatus to be cooled is higher than the preset third temperature t3.

The first fan part is a parallel fan group, the second fan part is also a parallel fan group, and a number of fans in the first fan part is same as that in the second fan part, and specifications of the fans in the first fan part and the second fan part are also the same.

Each temperature detect switch is set to: set a backlash protection at its own critical temperature.

There are two power supplies which are set to: provide electrical power to said first fan part and said second fan part respectively, and the rated voltages of the two power supplies are equal.

The beneficial effects of this present invention are:

In the fan type temperature control method and device of the present invention, the fans are controlled to stop, to rotate at half speed or to rotate at full speed with rational distribution and cooperation of the temperature detect switch, diode, and power supply by skillfully adopting the corresponding relationship between the fan working voltage and the fan speed. The present invention can achieve simple speed governing of the fans with no need to design complicated circuits or need of the printed circuit board (PCB), thus it is suitable for on-site modification. The temperature control method and device provided in the present invention have simple circuit connection relationship and can be implemented with low cost, they effectively realize the step control of the stop, rotate at half speed and rotate at full speed, extend the fan life, reduce the system noise, and assist in implementing energy conservation of the overall system.

PREFERRED EMBODIMENTS OF THE PRESENT INVENTION

Figure 1:
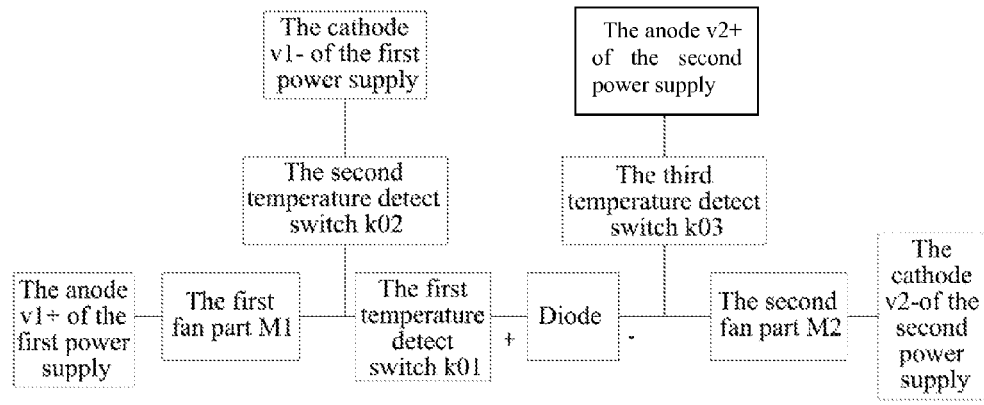
FIG. 1 is a structural diagram of a fan type temperature control device in accordance with an example of the present invention.

In the following, the present invention will be described in further detail with combination of the accompanying drawings and the specific embodiments.

In the following, firstly, the fan type temperature control method in the present invention will be described in detail:

The temperature of the apparatus to be cooled is pre-divided into three levels: low, medium and high. When the temperature of the apparatus to be cooled is lower than 30° C., it considers that the apparatus to be cooled is at the low temperature stage; when the temperature of the apparatus to be cooled is higher than 60° C., it considers that the apparatus to be cooled is at the high temperature stage; when the temperature of the apparatus to be cooled is between 30° C. and 60° C., it considers that the apparatus to be cooled is at the medium temperature stage. The fan type temperature control method in the present invention specifically comprises the following steps:

the step of low temperature processing, that is, when the temperature t of a apparatus to be cooled is lower than 30° C., circuits of all fans remain disconnected, i.e. all the fans stop;

a step of medium temperature processing, that is, when the temperature t of the apparatus to be cooled is higher than 30° C. but lower than 40° C., all the fans run with a speed less than the maximum speed. In the example, half of the voltage of the power supply of the temperature control device is applied to all the fans; when the temperature t of the apparatus to be cooled is higher than 40° C. while lower than 60° C., the voltage of the power supply of the temperature control device is applied to some of the fans, and the circuits of the others are disconnected, then some of the fans rotate at full speed while the others stop;

the step of high temperature processing, that is, when the temperature t of the apparatus to be cooled is higher than 60° C., the voltage of the power supply of the temperature control device is applied to all the fans, and all the fans rotate at full speed at this time.

According to the technical scheme provided in the present invention, the step of medium temperature processing may also be: when the temperature t of the apparatus to be cooled is higher than 30° C. while lower than 60° C., a voltage which is lower than the voltage of the power supply of the temperature control device is applied to all the fans, and all the fans run at a speed which is less than the maximum speed, which is corresponding to the case that the preset second temperature t2 equals to the preset third temperature t3 in the technical scheme of the present invention.

In the following, the fan type temperature control device in the present invention will be further described.

The fan type temperature control device in the present invention comprises power supplies, a fan unit, and a fan control unit.

Wherein, the fan unit comprises a plurality of fans, and is used to: cool an apparatus to be cooled; the power supplies are used to provide electrical power for the running of fans in the fan unit; said fan control unit is used to control the fans in the fan unit in accordance with the following scheme:

a) when temperature t of an apparatus to be cooled is lower than a preset first temperature t1, circuits of all fans remain disconnected, i.e. all the fans stop;

b) when the temperature t of the apparatus to be cooled is higher than the preset first temperature t1 and is lower than a preset second temperature t2, a voltage which is lower than a voltage of a power supply is applied to all the fans, and all the fans run at a speed which is less than the maximum speed;

when the temperature t of the apparatus to be cooled is higher than the preset second temperature t2 but lower than the preset third temperature t3, the voltage of the power supply of the temperature control device is applied to part of fans therein, meanwhile, the circuits of the other part of fans are disconnected, part of fans rotate at full speed, and the other part of fans stop;

c) when the temperature t of the apparatus to be cooled is higher than a preset third temperature t3, the voltage of the power supply of the temperature control device is applied to all the fans, and all the fans rotate at full speed at the time;

wherein, t1<t2≤t3.

FIG. 1 is a structural diagram of a fan type temperature control device in accordance with an example of the present invention, as shown in the diagram, in the example, said fan control unit comprises three temperature detect switches and one diode, and the three temperature detect switches are the first temperature detect switch k01, the second temperature detect switch k01 and the third temperature detect switch k03; said fan unit comprises two parts: the first fan part M1 and the second fan part M2, wherein, both said first fan part M1 and said second fan part M2 are parallel fan groups, and the number of fans in the first fan part M1 is same as that in the second fan part M2, and specifications of the fans are also the same; there are two power supplies, wherein, the first power supply v1 provides electrical power to said first fan part M1 and the second power supply v2 provides electrical power to said second fan part M2, and the rated voltages of the two power supplies are equal.

Wherein, one end of the first fan part M1 is connected to the anode v1+ of the first power supply and the other end is connected to one end of the first temperature detect switch k01, and the other end of the first temperature detect switch k01 is connected to the anode of the diode, one end of the second fan part M2 is connected to the cathode of the diode, and the other end is connected to the cathode v2− of the second power supply; one end of the second temperature detect switch k02 is connected between said first fan part M1 and said first temperature detect switch k01, and the other end is connected to the cathode v1− of the first power supply; one end of the third temperature detect switch k03 is connected to the cathode of the diode, and the other end is connected to the anode v2+ of the second power supply;

The first temperature detect switch k01 is closed when the temperature t of the apparatus to be cooled is higher than the preset first temperature t1; the second temperature detect switch k02 is closed when the temperature t of the apparatus to be cooled is higher than the preset second temperature t2; the third temperature detect switch k03 is closed when the temperature t of the apparatus to be cooled is higher than the preset third temperature t3. Each temperature detect switch sets a backlash protection at its own critical temperatures to avoid that the fan speed oscillates or changes at the temperature critical point of each temperature detect switch.

The working principle of the fan type temperature control device in the present invention is as follows:

(1) $t < t1$

When $t < t1$, the first temperature detect switch k01, the second temperature detect switch k02, and the third temperature detect switch k03 are disconnected, the power supply loops of the first fan part M1 and the second fan part M2 are disconnected, each fan in the first fan part M1 stops, and each fan in the second fan part M2 also stops.

Figure 2:
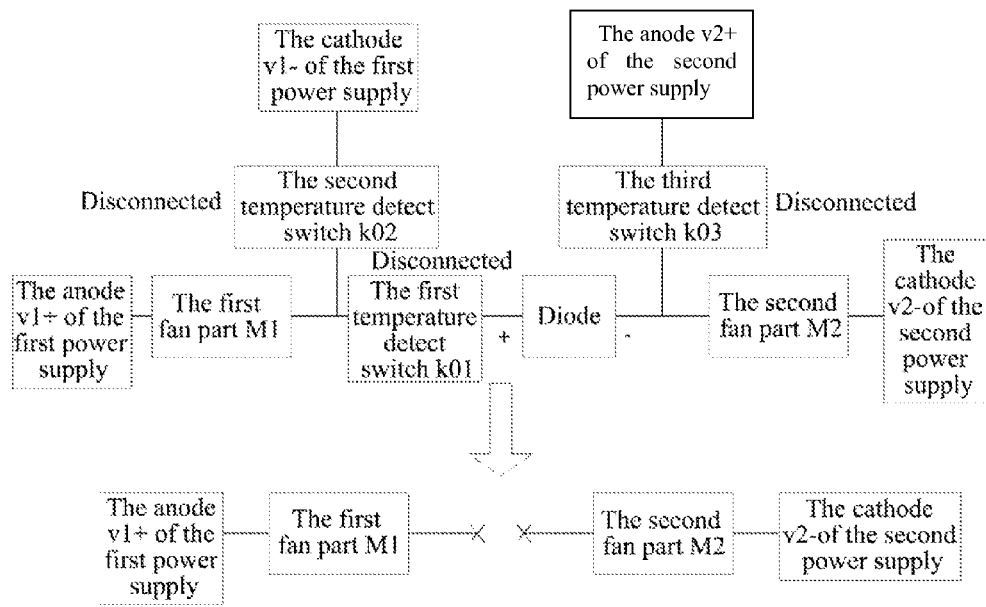
FIG. 2 is an equivalent schematic diagram when both the first fan part M1 and the second fan section M2 stop when T<t1.

The equivalent circuit is shown in FIG. 2.

(2) $t1 < t < t2$

When $t1 < t < t2$, the first temperature detect switch k01 is closed, the second temperature detect switch k02 is disconnected, and the third temperature detect switch k03 is disconnected, a forward voltage is across the diode and the diode is conductive. The power supply loop from "the anode V1+ of the first power supply to the first fan part M1, to the first temperature detect switch k01, to the diode, to the second fan part M2, and to the cathode V2− of second power supply" is conductive, the power supply voltage is equally split to the first fan part M1 and the second fan part M2, each fan in the first fan part M1 rotate at half speed, and each fan in the second fan part M2 rotate at half speed.

Figure 3:
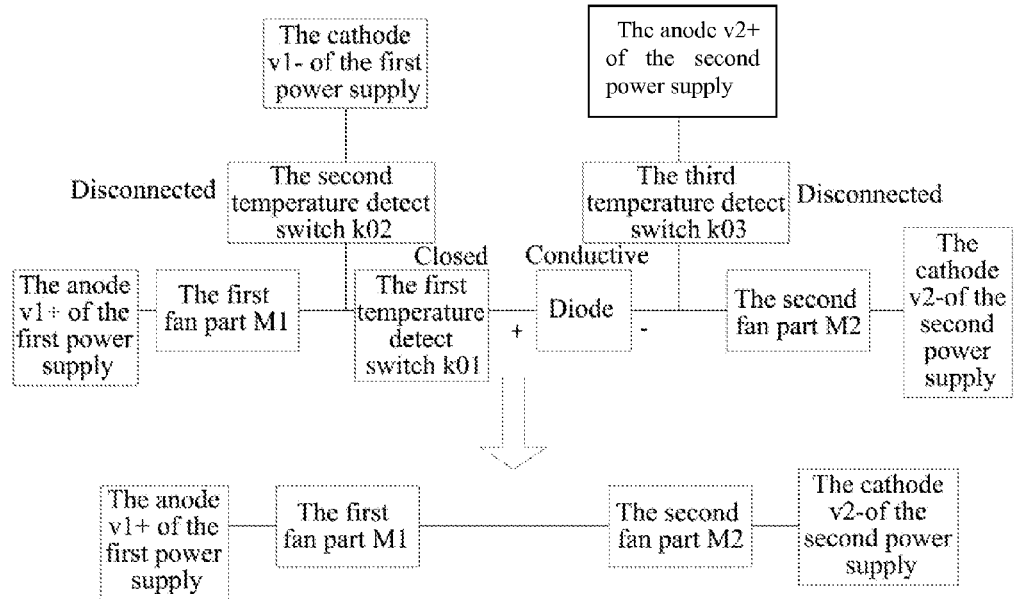
FIG. 3 is an equivalent schematic diagram when both the first fan part M1 and the second fan section M2 rotate at half speed when t1<t<t2.

The equivalent circuit is shown in FIG. 3.

(3) $t1 < t2 < t < t3$

When $t1 < t2 < t < t3$, the first temperature detect switch k01 is closed, the second temperature detect switch k02 is closed, the temperature detect switch k03 is disconnected, a reverse voltage is across the diode and the diode is cut off. The power supply loop "from the anode of the first power supply to the first fan part M1 to the second temperature detect switch k02 to the cathode V1− of the first power supply" is conductive, the power supply voltage is applied to both ends of the first fan part M1, each fan in the first fan part M1 rotate at full speed. The power supply circuit of the second fan part M2 is disconnected and each fan in the second fan part M2 stops.

Figure 4:
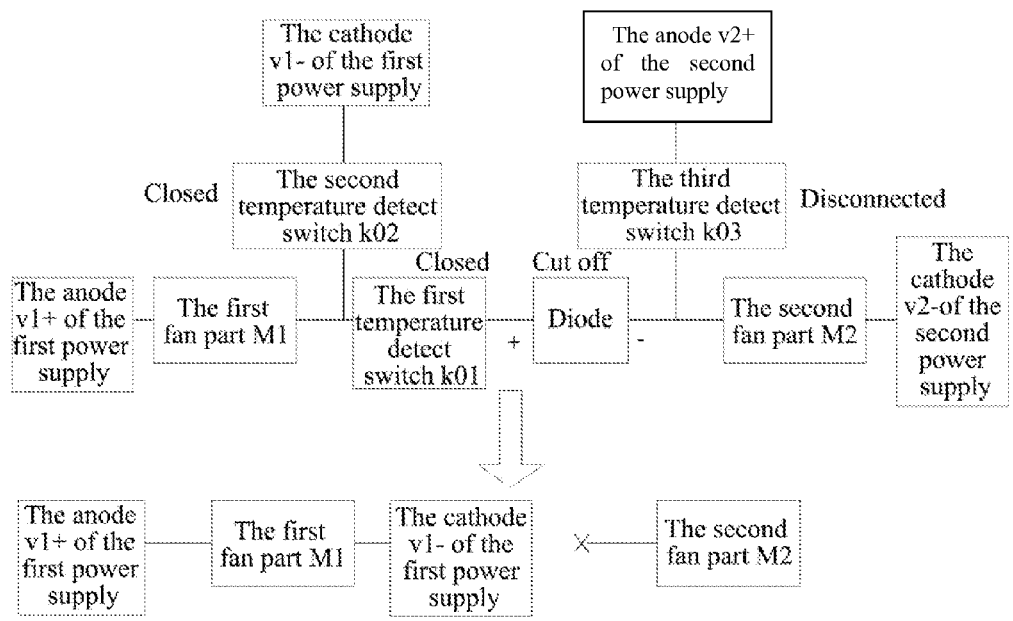
FIG. 4 is an equivalent schematic diagram when the first fan part M1 rotates at full speed while the second fan part M2 stops when t1<t2<t<t3.

The equivalent circuit is shown in FIG. 4.

(4) $t1 < t2 < t3 < t$

When $t1 < t2 < t3 < t$, the first temperature detect switch k01 is closed, the second temperature detect switch k02 is closed, and the temperature detect switch k03 is closed, the reverse voltage is across the diode, and the diode is cut off. The power supply loop from the anode v1+ of the first power supply to the first fan part M1, to the second temperature detect switch k02, and to the cathode v1− of the first power supply" is conductive, the supply voltage is applied to both ends of the first fan part M1, and each fan in the first fan part M1 rotates rotate at full speed.

The power supply loop "from the anode v2+ of the second power supply to the second temperature detect switch k02, to the second fan part M2, and to the cathode v2− of the second power supply" is conductive, the power supply voltage is applied to both ends of the second fan part M2, and each fan in the second fan part M2 rotate at full speed.

Figure 5:
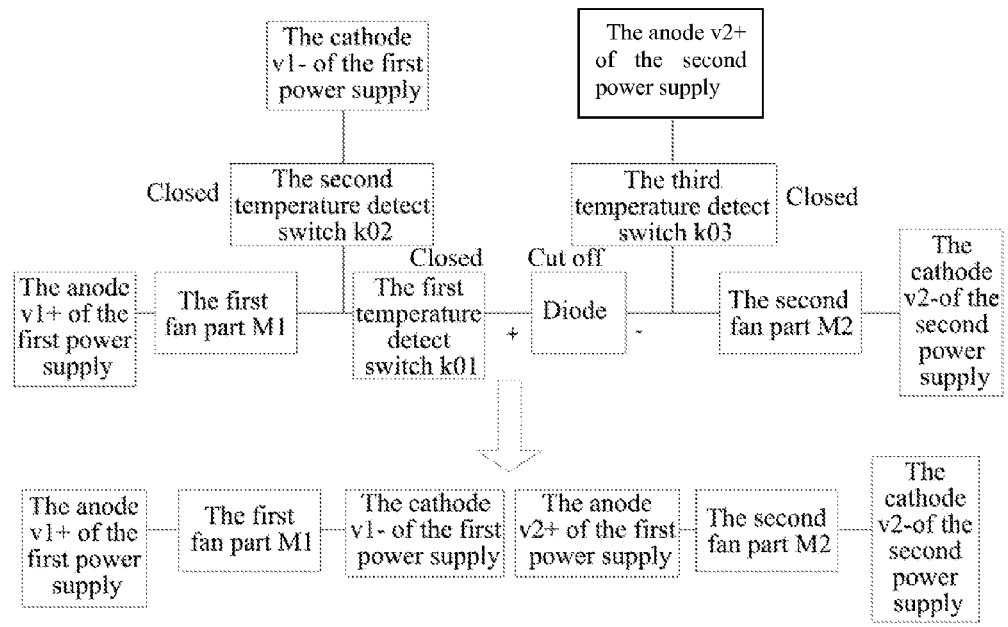
FIG. 5 is an equivalent schematic diagram when both the first fan part M1 and the second fan part M2 rotate at full speed when t1<t2<t3<t.

The equivalent circuit is shown in FIG. 5.

When the critical temperature t1 of the first temperature detect switch k01<the critical temperature t3 of the third Temperature detect k03<the critical temperature t2 of the second temperature detect switch k02, the work flow of the fan type temperature control device in the present invention is as follows: when t<t1, each fan in the first fan part M1 stops, each fan in the second fan part M2 stops; when t2<t<t1, each fan in the second fan part M2 rotate at half speed, and each fan in the first fan part M1 rotates at half speed; when t1<t3<t<t2, each fan in the second fan part M2 rotate at full speed, and each fan in the first fan part M1 stops; when t1<t3<t2<t, each fan in the first fan part M1 rotate at full speed, and each fan in the second fan part M2 rotate at full speed.

When the critical temperature t1 of the first temperature detect switch k01<the critical temperature t2 of the second temperature detect switch k02, the critical temperature t2 of the second temperature detect switch k02=the critical temperature t3 of the third temperature detect switch k03, the work flow of the fan type temperature control device in the present invention is: when t<t1, the first temperature detect switch k01, the second temperature detect switch k02, and the third temperature detect switch k03 are disconnected, the power supply loops of the first fan part M1 and the second fan part M2 are disconnected, each fan in the first fan part M1 stops and each fan in the second fan part M2 stops. When t1<t<t2, the first temperature detect switch k01 is closed, the second temperature detect switch k02 is disconnected, the third temperature detect switch k03 is disconnected, the forward voltage is across both ends of the diode, and the diode is conductive. The power supply loop "from the anode V1+ of the first power supply, to the first fan part M1, to the first temperature detect switch k01, to the diode, to the second fan part M2, and to the cathode V2− of the second power supply" is conductive, the supply voltage is equally split to the first fan part M1 and the second fan part M2, each fan in the first fan part M1 rotate at half speed, and each fan in the second fan part M2 rotate at half speed. When t1<t2=t3<t, the first temperature detect switch k01 is closed, the second temperature detect switch k02 is closed, and the third temperature detect switch k03 is closed, a reverse voltage is across both ends of the diode and the diode is cut off. The power supply loop "from the anode v1+ of the first power supply, to the first fan part M1, to the second temperature detect switch k02, to the cathode v1− of the first power supply" is conductive, the supply voltage is applied to both ends of the first fan part M1, each fan in the first fan part M1 rotate at full speed. The power supply circuit "from the anode v2+ of the second power supply, to the second temperature detect switch k02, to the second fan part M2, and to the cathode v2− of the second power supply" is conductive, the power supply voltage is applied to both ends of the second fan part M2, and each fan in the second fan part M2 rotate at full speed.

In the examples of the present invention, the critical temperature point of each temperature detect switch is designed with the backlash protection in order to avoid fan speed instability and system oscillation because the temperature control unit is frequently closed or disconnected around the critical temperatures (that is, t1, t2, t3).

Figure 6:
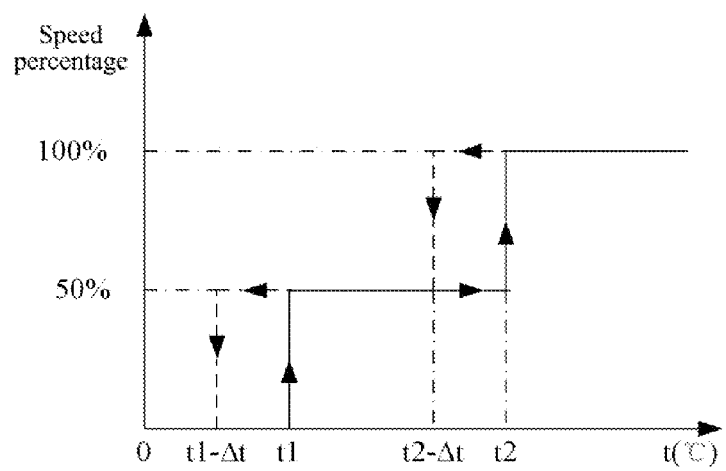
FIG. 6 is a schematic diagram of backlash of the critical temperature point of each temperature detect switch.

FIG. 6 is a schematic diagram of backlash of the critical temperature point of each temperature detect switch, as shown in FIG. 6, when the ambient temperature t, that is, the temperature t of a apparatus to be cooled, decreases, and t2−Δt<t<t2, since it is in the Δt temperature backlash protection scope, the fans rotate at full speed. When the ambient temperature t reduces to between t2−Δt and t1, which exceeds the temperature backlash protection scope, the fans are adjusted to rotate at half speed. When the ambient temperature t continues to decline, and t1−Δt<t<t1, since it is in the temperature backlash protection scope, the fan speed maintains at the half speed. When the ambient temperature t is reduced to below t1−Δt, which exceeds the temperature backlash protection scope, the fans are controlled to stop. Each temperature detect switch sets a temperature backlash in order to avoid that the fan speed oscillates or changes at the temperature critical points.

In the following, a specific example of the fan type temperature control device IN the present invention is provided.

Figure 7:
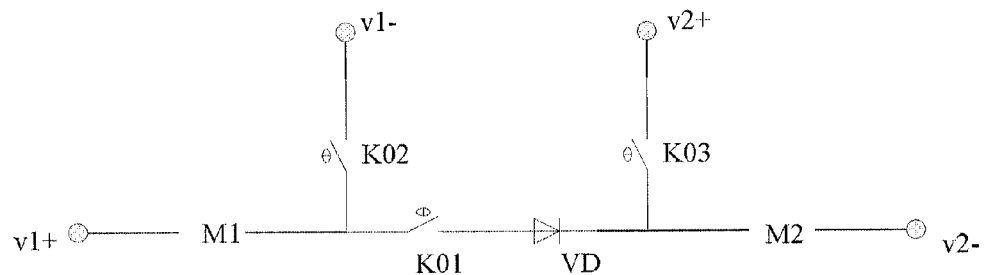
FIG. 7 is a diagram of a specific example of the fan type temperature control device in the present invention.

Take a communication base station for example, the outdoor power supply heat exchange method of the base station uses fans to cool, the first fan part M1 and the second fan part M2 are two fan groups with the same model of the fans, the same number of fans, and whose power supply voltages meet the power supply voltage level, moreover, the two fan groups are both parallel fan groups. The first power supply v1 is used to provide electricity energy to the first fan part M1, and the second power supply v2 is used to provide electricity energy to the second fan part M2. The temperature for closing the first temperature detect switch K01 is 30° C., the temperature for closing the second temperature detect switch K02 is 40° C., and the temperature for closing the third Temperature detect K03 is 60° C., the backlash Δt of each temperature detect switch is 5° C. The fan type temperature device circuit in this example is shown in FIG. 7, and its work flow is as follows:

(1) t<30° C.

When t<30° C., the first temperature detect switch K01, the second temperature detect switch K02 and the third temperature detect K03 are disconnected, the power, supply loops of the first fan part M1 and the second fan part M2 are disconnected, each fan in the first fan part M1 stops, and each fan in the second fan part M2 stops.

(2) 30° C.<t<40° C.

when 30° C.<t<40° C., the first temperature detect switch K01 is closed, the second temperature detect switch K02 is disconnected, and the third Temperature detect K03 is disconnected, the diode VD is conductive in the forward direction. The power supply loop "from the anode V1+ of the first power supply, to the first fan part M1, to the first temperature detect switch K01, to the diode VD, to the second fan part M2, to the cathode V2− of the second power supply" is conductive, the power supply voltage is equally split to the first fan part M1 and the second fan part M2, each fan in the first fan part M1 rotates at half speed, and each fan in the second fan part M2 rotates at half speed.

(3) 30° C.<40° C.<t<60° C.

When T1<T2<t<T3, the first temperature detect switch K01 is closed, the second temperature detect switch K02 is closed, the third Temperature detect K03 is disconnected, and the diode VD is reversely cut-off. The power supply circuit "from the anode V1+ of the first power supply, to the first fan part M1, to the second temperature detect switch K02, to the cathode V1− of the first power supply" is conductive, the power supply voltage is applied to the both ends of the first fan part M1, each fan in the first fan part M1 rotates at full speed. The power supply circuit of the second fan part M2 is disconnected, and each fan in the second fan part M2 stops.

(4) 30° C.<40° C.<60° C.<t

When 30° C.<40° C.<60° C.<t, the first temperature detect switch K01 is closed, the second temperature detect switch K02 is closed, the third Temperature detect K03 is closed, and the diode VD is reversely cut off. The power supply circuit "from the anode V1+ of the first power supply, to the first fan part M1, to the second temperature detect switch K02, to the cathode V1− of the first power supply" is conductive, the supply voltage is applied at both ends of the first fan part M1, each fan in the first fan part M1 rotates at full speed.

The power supply loop "from the anode V2+ of the second power supply, to the second temperature control switch K02, to the second fan part M2, to the cathode V2− of the second power supply" is conductive, the power supply voltage is applied at both ends of the second fan part M2, and each fan in the second fan part M2 rotates at full speed.

Figure 8:
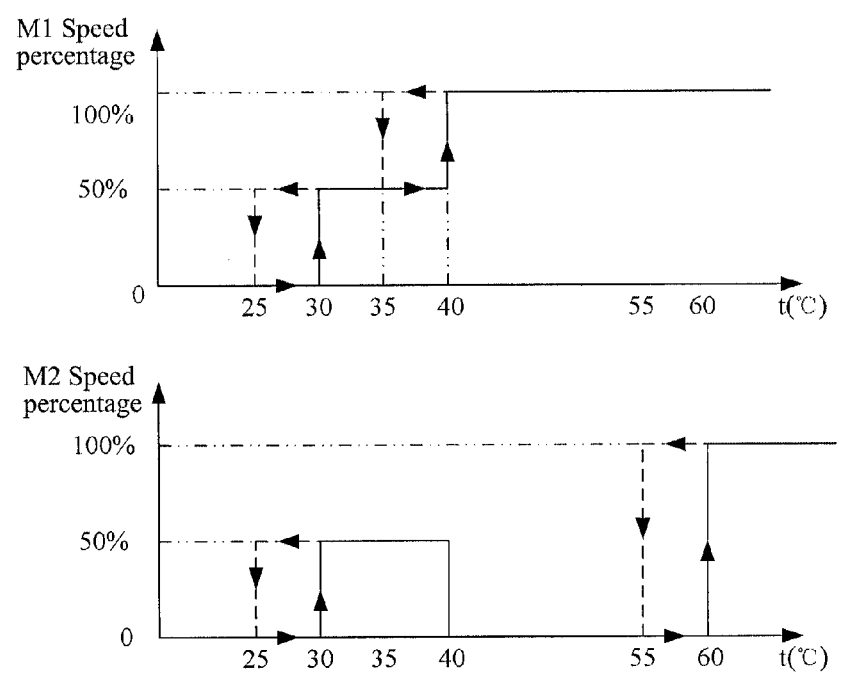
FIG. 8 is a diagram of the speeds of the first fan part M1 and the second fan part M2 in accordance with an example of the present invention.

The speed change of the first fan part M1 and the second fan part M2 with the change of the temperature of the apparatus to be cooled is shown in FIG. 8.

In summary, by the low-cost fan type temperature control method and device provided in the present invention, it is advantageous to achieve step speed control of fans, effectively extend the fan life, reduce system noise, and help to implement the energy conservation of the overall system at the same time.

The aforementioned specific examples further illustrate the purpose, the technical scheme and the beneficial effects of the present invention, it should be noted that the above description is only the specific examples of the present invention, those skilled in the field can make various modifications and variations without departing from the spirit and scope of the present invention. Thus, if these modifications and variations of the present invention are within the scope of the technical scheme recorded in the claims of the present invention and its equivalents, the present invention is also intended to include these modifications and variations.

INDUSTRIAL APPLICABILITY

In the fan type temperature control method and device of the present invention, the fans are controlled to stop, to rotate at half speed or to rotate at full speed with rational distribution and cooperation of the temperature detect switch, diode, and power supply by skillfully adopting the corresponding relationship between the fan working voltage and the fan speed. The present invention can achieve simple speed governing of the fans with no need to design complicated circuits or need of the printed circuit board (PCB), thus it is suitable for on-site modification. The temperature control method and device provided in the present invention have simple circuit connection relationship and can be implemented with low cost, they effectively realize the step control of the stop, rotate at half speed and rotate at full speed, extend the fan life, reduce the system noise, and assist in implementing energy conservation of the overall system.

What is claimed is:

1. A fan type temperature control method, comprising:
a step of low temperature processing, in which when temperature t of an apparatus to be cooled is lower than a preset first temperature t1, circuits of all fans remain disconnected, and all the fans stop;
a step of medium temperature processing, in which when the temperature t of the apparatus to be cooled is higher than the preset first temperature t1 and is lower than a preset second temperature t2, a voltage which is lower than a voltage of a power supply of a temperature control device is applied to all the fans, and all the fans rotate at a speed which is less than a maximum speed; and
a step of high temperature processing, in which when the temperature t of the apparatus to be cooled is higher than a preset third temperature t3, the voltage of the power supply of the temperature control device is applied to all the fans, and all the fans rotate at full speed;
wherein, t1<t2≤t3; and
a fan control unit comprises three temperature detect switches and one diode, and the three temperature detect switches are a first temperature detect switch, a second temperature detect switch and a third temperature detect switch;
one end of a first fan part is connected to an anode of a first power supply and the other end is connected to one end of the first temperature detect switch, the other end of the first temperature detect switch is connected to an anode of the diode, one end of a second fan part is connected to a cathode of the diode, and the other end of the second fan part is connected to a cathode of a second power supply; one end of the second temperature detect switch is connected between said first fan part and said first temperature detect switch, and the other end is connected to a cathode of the first power supply; one end of the third temperature detect switch is connected to the cathode of the diode, and the other end is connected to an anode of the second power supply;
the first temperature detect switch is to be closed when the temperature t of the apparatus to be cooled is higher than the preset first temperature t1;
the second temperature detect switch is to be closed when the temperature t of the apparatus to be cooled is higher than the preset second temperature t2;
the third temperature detect switch is to be closed when the temperature t of the apparatus to be cooled is higher than the preset third temperature t3.

2. The fan type temperature control method of claim 1, wherein,
the step of medium temperature processing also comprises: when t2<t3, and the temperature t of the apparatus to be cooled is higher than the preset second temperature t2 but lower than the preset third temperature t3, the voltage of the power supply of the temperature control device is applied to a first fan part, meanwhile, the circuit of a second fan part is disconnected, the first fan part rotate at full speed, and the second fan part stops.

3. The fan type temperature control method of claim 2, wherein,
in the step of medium temperature processing, the voltage lower than the voltage of the power supply of the temperature control device is a half of the voltage of the power supply of the temperature control device.

4. The fan type temperature control method of claim 1, wherein,
in the step of medium temperature processing, the voltage lower than the voltage of the power supply of the temperature control device is a half of the voltage of the power supply of the temperature control device.

5. A fan type temperature control device, comprising a fan unit, a power supply and a fan control unit; wherein,
the fan unit comprises a plurality of fans, and the fan unit is set to: cool an apparatus to be cooled;

the power supply is set to: provide electrical power for running of the fans in the fan unit;

the fan control unit is set to: control the fans in the fan unit based on a following scheme:

when temperature t of the apparatus to be cooled is lower than a preset first temperature t1, circuits of all fans remain disconnected, and all the fans stop;

when the temperature t of the apparatus to be cooled is higher than the preset first temperature t1 and is lower than a preset second temperature t2, a voltage which is lower than a voltage of the power supply of a temperature control device is applied to all the fans, and all the fans rotate at a speed which is less than a maximum speed;

when the temperature t of the apparatus to be cooled is higher than a preset third temperature t3, the voltage of the power supply of the temperature control device is applied to all the fans, and all the fans rotate at full speed;

wherein, $t1<t2\leq t3$;

said fan control unit comprises three temperature detect switches and one diode, and the three temperature detect switches are a first temperature detect switch, a second temperature detect switch and a third temperature detect switch;

one end of a first fan part is connected to an anode of a first power supply and the other end is connected to one end of the first temperature detect switch, the other end of the first temperature detect switch is connected to an anode of the diode, one end of a second fan part is connected to a cathode of the diode, and the other end of the second fan part is connected to a cathode of a second power supply; one end of the second temperature detect switch is connected between said first fan part and said first temperature detect switch, and the other end is connected to a cathode of the first power supply; one end of the third temperature detect switch is connected to the cathode of the diode, and the other end is connected to an anode of the second power supply;

the first temperature detect switch is set to be closed when the temperature t of the apparatus to be cooled is higher than the preset first temperature t1;

the second temperature detect switch is set to be closed when the temperature t of the apparatus to be cooled is higher than the preset second temperature t2;

the third temperature detect switch is set to be closed when the temperature t of the apparatus to be cooled is higher than the preset third temperature t3.

6. The fan type temperature control device of claim 5, wherein, the fan unit comprises the first fan part and the second fan part; the fan control unit is also set to: the scheme used to control the fans in the fan unit further comprises:

when t2<t3, and the temperature t of the apparatus to be cooled is higher than the preset second temperature t2 but lower than the preset third temperature t3, the voltage of the power supply of the temperature control device is applied to a first fan part, meanwhile, the circuit of a second fan part is disconnected, the first fan part rotate at full speed, and the second fan part stops.

7. The fan type temperature control device of claim 6, wherein,
the first fan part is a parallel fan group, the second fan part is also a parallel fan group, and a number of fans in the first fan part is same as that in the second fan part, and specifications of the fans in the first fan part and the second fan part are also the same.

8. The fan type temperature control device of claim 6, wherein,
each temperature detect switch is set to: set a backlash protection at its own critical temperature.

9. The fan type temperature control device of claim 6, wherein,
there are two power supplies which are set to: provide electrical power to said first fan part and said second fan part respectively, and rated voltages of the two power supplies are equal.

10. The fan type temperature control device of claim 5, wherein,
said fan control unit is set to: the voltage lower than the voltage of the power supply is half of the voltage of the power supply.

11. The fan type temperature control device of claim 10, wherein,
the first fan part is a parallel fan group, the second fan part is also a parallel fan group, and a number of fans in the first fan part is same as that in the second fan part, and specifications of the fans in the first fan part and the second fan part are also the same.

12. The fan type temperature control device of claim 10, wherein,
each temperature detect switch is set to: set a backlash protection at its own critical temperature.

13. The fan type temperature control device of claim 10, wherein,
there are two power supplies which are set to: provide electrical power to said first fan part and said second fan part respectively, and rated voltages of the two power supplies are equal.

14. The fan type temperature control device of claim 5, wherein,
the first fan part is a parallel fan group, the second fan part is also a parallel fan group, and a number of fans in the first fan part is same as that in the second fan part, and specifications of the fans in the first fan part and the second fan part are also the same.

15. The fan type temperature control device of claim 5, wherein,
each temperature detect switch is set to: set a backlash protection at its own critical temperature.

16. The fan type temperature control device of claim 5, wherein,
there are two power supplies which are set to: provide electrical power to said first fan part and said second fan part respectively, and rated voltages of the two power supplies are equal.

* * * * *